Figure 1:
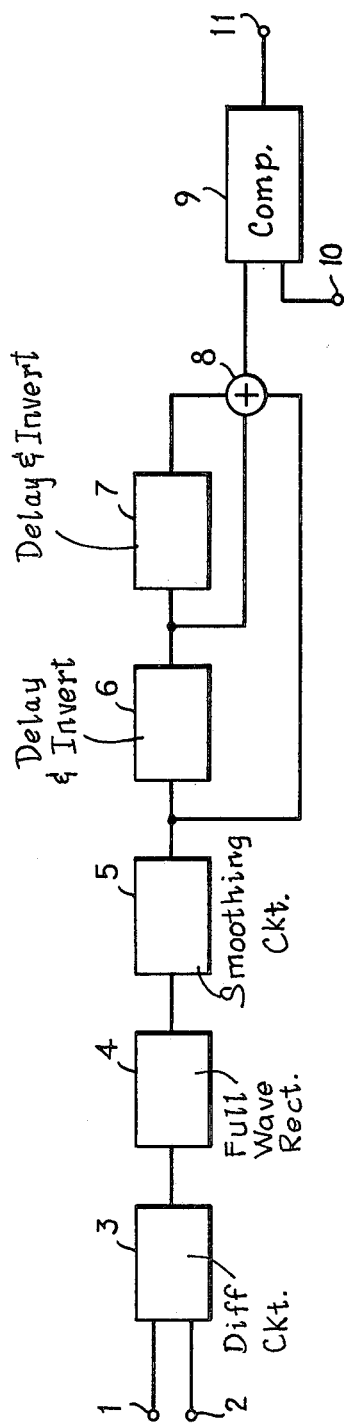

United States Patent [19]
Buckner

[11] 4,220,926
[45] Sep. 2, 1980

[54] NOISE DETECTOR EMPLOYING PLURAL DELAY CIRCUITS

[75] Inventor: Ian W. Buckner, Lea, Nr. Malmesbury, England

[73] Assignee: Plessey Handel und Investments AG., Zug, Switzerland

[21] Appl. No.: 935,942

[22] Filed: Aug. 23, 1978

[30] Foreign Application Priority Data

Aug. 26, 1977 [GB] United Kingdom ............... 35984/77
Aug. 26, 1977 [GB] United Kingdom ............... 35985/77

[51] Int. Cl.² ...................... H03K 5/159; H03K 5/18; H03K 17/16
[52] U.S. Cl. ................................... 328/165; 328/111; 455/303
[58] Field of Search ............... 328/111, 165; 307/234; 325/348, 474, 478

[56] References Cited

U.S. PATENT DOCUMENTS

| | | | |
|---|---|---|---|
| 3,600,688 | 8/1971 | Booth | 328/111 |
| 3,886,463 | 5/1975 | Laprio | 307/234 X |
| 3,906,379 | 9/1975 | Tuhro | 307/234 X |
| 3,940,698 | 2/1976 | Itoh | 325/348 |
| 3,979,679 | 9/1976 | Bush et al. | 325/348 |
| 4,162,453 | 7/1979 | Rudolph | 328/111 |

*Primary Examiner*—John S. Heyman
*Attorney, Agent, or Firm*—Fleit & Jacobson

[57] ABSTRACT

An impulse noise detector, for use in impulse noise suppressor circuits which are used for suppressing scratch noises in disc record players, comprises a rectifier operable on an applied signal to provide a rectified signal, a smoothing circuit for smoothing the rectified signal, a pair of delay and invert circuits operable on the smoothed signal for affording a corresponding plurality of time delayed signals, and a combiner for selectively combining the time delayed signals to afford an output which is indicative of the presence, in the applied signal, of impulse noise.

5 Claims, 2 Drawing Figures

NOISE DETECTOR EMPLOYING PLURAL DELAY CIRCUITS

This invention relates to detector arrangements and relates more especially to an impulse noise detector for use in impulse noise suppressor circuits such as are used for scratch suppression in disc record players. This invention also relates to an impulse noise suppressor circuit including an impulse noise detector of the invention.

According to the present invention, there is provided an impulse noise detector comprising rectifier means operable on an applied signal, smoothing means for smoothing the rectified signal and a plurality of delay means operable on the smoothed signal for affording a plurality of time delayed signals with means for selectively combining the time delayed signals to afford an output which is indicative of the presence in the applied signal of impulse noise.

Preferably the plurality of delay means are each delay and inverter means. Advantageously, the plurality of delay means are each constituted by a circuit having a pair of series connected operational amplifiers, the gain of which is defined in dependence upon the value of feedback resistance.

The means for selectively combining the time delayed signals may be a combiner and comparator arrangement.

Figure 2:
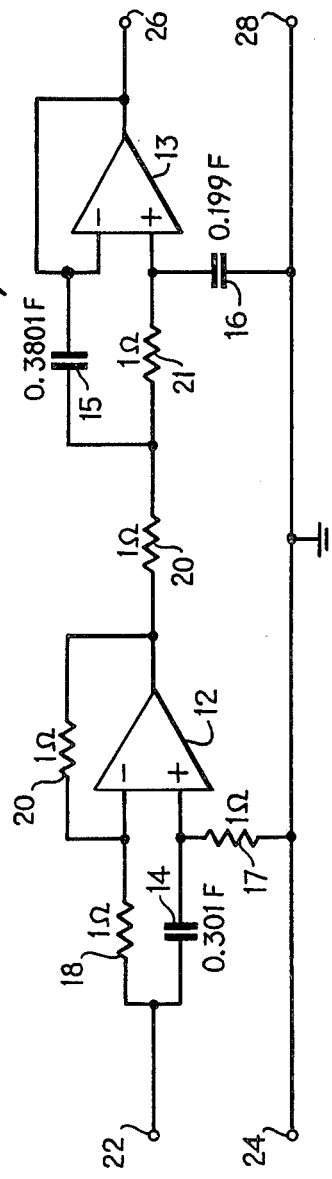

Embodiments of the invention will now be described solely by way of example and with reference to the accompanying drawings in which:

FIG. 1 is a block schematic diagram of an impulse noise detector in accordance with the present invention; and FIG. 2 shows a detailed delay and invert circuit.

The impulse noise or scratch detector shown in FIG. 1 will be described as being applicable to a stereo disc record playing system. It is to be appreciated, however, that the principles of impulse noise detection to be described are applicable to single channel (mono) or other multi-channel disc record playing systems as well as to applications where it is required to detect impulse noise.

The impulse noise or scratch detector depicted in FIG. 1 may be used as the scratch detection circuit 10 of the impulse noise suppressor circuit of FIG. 1 of our co-pending British Patent Application No. 35983/77, corresponding to U.S. Ser. No. 935,491, filed on Aug. 23, 1978. The impulse noise detector is provided with a left channel input 1 and a right channel input 2. The left and right channel inputs 1 and 2 are both applied to a difference circuit 3 which incorporates a high pass filter, the output of which is rectified in a full wave rectifier 4. The output of the rectifier 4 is applied to a smoothing circuit 5 typically having a time constant approximately equal to 100 μSec. the smoothed output from which is applied to two series connected delay and invert circuits 6 and 7 each of which is assumed to afford a delay equal to D.

The output from the smoothing circuit 5 together with the outputs from the two delay and invert circuits 6 and 7 are each summed in a combiner 8 which affords an output to a comparator 9. In the comparator 9 the combined output from the combiner 8 is compared with a reference signal applied to a reference level input 10 of the comparator to afford an output via output 11. By changing the level of the reference signal applied to reference level input 10 the sensitivity of the detector may be varied.

In operation of the detector described, it can be shown that an output will only be afforded if the period of any applied pulse is less than 2D where D is the delay afforded by each of the delay and invert circuits 6 and 7 and also if the combined output from the combiner 8 exceeds the applied reference level.

Referring now to FIG. 2, there is shown a preferred delay and invert circuit for the delay and invert circuits 6 or 7 shown in FIG. 1. This delay circuit of FIG. 2 derives from a general procedure proposed by A. Budak in an article "A Maximally Flat Phase and Controllable Magnitude Approximation" published in the Transactions I.E.E.E. Circuit Theory, CT12 No. 2, June 1965. Budak's proposal was to introduce a parameter k to split $e^{-s}$ into two parts such that $$e^{-s} = e^{-ks}/e^{-(k-1)s}$$

where
$0 < k < 1$
$e =$ the exponential function which as is well known has a value of approximately 2.718
$s =$ the complex frequency variable, i.e. the Laplace operator and then approximate independently $e^{-ks}$ and $e^{-(k-1)s}$ with all-pole Bessel polynomials.

The resulting approximation will have Bessel polynomials in both numerator and denominator. The poles of the approximation to $e^{-(k-1)s}$ will be the zeros in the overall approximation to $e^{-s}$, and the poles of the approximation to $e^{-ks}$ will remain as poles in the overall approximation. For realizability, the degree of the $e^{-(k-1)s}$ approximant must be less than the degree of the $e^{-ks}$ approximant.

The realization of the prescribed function is achieved by means of conventional active or passive filters. This realization is often difficult and it may result in a complex and expensive network.

The improvement that forms the basis of FIG. 2 is to choose the parameter k such that the active or passive filter realization of the prescribed function becomes particularly easy and economical. This is achieved by ensuring that the prescribed function consists of an all-pass network and a low-pass network.

In FIG. 2, the overall prescribed function consists of a first-order all-pass and a second-order low-pass function. This is realized as shown with two amplifiers 12, 13 (13 being a simple unity gain buffer), three capacitors 14, 15, 16 and five resistors 17, 18, 19, 20, 21. The circuit has input terminals 22, 24 and output terminals 26, 28 and it is very straightforward to design and clearly very economical. As is shown in FIG. 2, the amplifiers 12, 13 are serially connected operational amplifiers, the gain of which is defined in dependence upon the value of feedback resistance. The normalized values of the circuit components are shown in FIG. 2, resistance being in ohms and capacitance in farads. The input impedance is 1 ohm and the output impedance is low. Impedance sealing on the components associated with each amplifier 12, 13 may be performed separately for each amplifier 12, 13. As will be explained below, the preferred realization of the prescribed filter is with k approximately equal to 0.699.

The prescribed function must have one zero and three poles in order to allow the above realization. A first order approximation is required for $e^{-(k-1)s}$ and a third order approximation for $e^{-ks}$.

$$e^{-(k-1)s} \simeq \frac{1}{1 + (k-1)s}$$

$$e^{-ks} \simeq \frac{1}{1 + ks + \frac{2k^2s^2}{5} + \frac{k^3s^3}{15}}$$

For the required realization, $(1+(1-k)s)$ must be a factor of the denominator of the realization of $e^{-ks}$. This is achieved by choosing $k=0.6990$ (approximately) as mentioned above. The overall function becomes (still in normalized form)

$$F(s) = \frac{(1 - 0.301s)}{(1 + 0.301s)(1 + 0.39799s + 0.075644s^2)}$$

The quality of the factor of the second-order lag is low (0.691) and is therefore easy to implement.

The overall performance of the (normalized) filter results in a 1 second delay time with a bandwidth of approximately 0.8 Hz at $-3$ dB. The step response exhibits a single undershoot of about 5% amplitude prior to the output step.

The performance of the network is well suited for detecting the envelope of the signal produced by a scratch on a record. A 350 microsecond delay time is necessary in practice resulting in an amplitude reduction of the pulse of approximately 10%, which is easily compensated for.

It is to be appreciated that the embodiments of the invention described above have been given by way of example only and that modifications may be effected. Thus, for example, the technique of choosing k values to result in an easily implemented filter may be extended to higher order filters.

What we claim is:

1. An impulse noise detector comprising rectifier means operable on an applied signal to provide a rectified signal, smoothing means for smoothing the rectified signal, a plurality of delay means for operating on the smoothed signal to afford a corresponding plurality of time delayed signals, and means for selectively combining the corresponding plurality of time delayed signals to afford an output which is indicative of the presence, in the applied signal, of impulse noise;

wherein each of the plurality of delay means operates in accordance with a function $$e^{-s} = e^{-ks}/e^{-(k-1)s}$$

where
$0 < k < 1$
$e$ = the exponential function of approximately 2.718
$s$ = the complex frequency variable.

2. An impulse noise detector according to claim 1, wherein each of the plurality of delay means comprises a delay and inverter circuit.

3. An impulse noise detector according to claim 1, wherein each of the plurality of delay means comprises a circuit having a pair of series connected operational amplifiers having a feedback resistance and a gain which is defined in dependence upon the value of said feedback resistance.

4. An impulse noise detector according to claim 1 wherein k is 0.6990.

5. An impulse noise detector according to claim 4, wherein said means for selectively combining the time delayed signals comprises a combiner and comparator arrangement.

* * * * *